US007287235B1

(12) United States Patent
Hasteer et al.

(10) Patent No.: US 7,287,235 B1
(45) Date of Patent: Oct. 23, 2007

(54) METHOD OF SIMPLIFYING A CIRCUIT FOR EQUIVALENCE CHECKING

(75) Inventors: Gagan Hasteer, San Jose, CA (US); Deepak Goyal, Santa Clara, CA (US)

(73) Assignee: Calypto Design Systems, Inc., Santa Clara, CA (US)

( * ) Notice: Subject to any disclaimer, the term of this patent is extended or adjusted under 35 U.S.C. 154(b) by 418 days.

(21) Appl. No.: 10/912,985

(22) Filed: Aug. 6, 2004

(51) Int. Cl.
*G06F 17/50* (2006.01)
*H03L 7/06* (2006.01)
*H03L 7/00* (2006.01)
*H03H 11/26* (2006.01)

(52) U.S. Cl. .................. 716/2; 716/1; 716/3; 716/4; 716/5; 716/6; 703/15; 327/158; 327/161; 327/280

(58) Field of Classification Search ................ 716/1–6; 714/722; 713/401; 365/189.04, 233; 327/12, 327/17, 51, 156, 158, 161, 280
See application file for complete search history.

(56) References Cited

U.S. PATENT DOCUMENTS

| | | | | |
|---|---|---|---|---|
| 4,879,505 A * | 11/1989 | Barrow et al. | ............... | 323/312 |
| 5,545,977 A * | 8/1996 | Yamada et al. | ............. | 323/313 |
| 5,576,997 A * | 11/1996 | Masuda et al. | ........ | 365/189.04 |
| 5,717,697 A * | 2/1998 | Yin | ............................ | 714/722 |
| 6,065,126 A * | 5/2000 | Tran et al. | ................... | 713/401 |
| 6,066,794 A * | 5/2000 | Longo | ......................... | 84/626 |
| 6,087,868 A * | 7/2000 | Millar | ........................ | 327/156 |
| 6,091,259 A * | 7/2000 | DeLange | ..................... | 326/17 |
| 6,247,163 B1 | 6/2001 | Burch et al. | | |
| 6,301,191 B1 * | 10/2001 | Ooishi | ........................ | 365/233 |
| 6,301,553 B1 * | 10/2001 | Burgun et al. | ................ | 703/15 |
| 6,496,955 B1 | 12/2002 | Chandra et al. | | |
| 6,598,171 B1 * | 7/2003 | Farmwald et al. | .......... | 713/401 |
| 6,600,352 B2 * | 7/2003 | Miyamoto | ................... | 327/161 |
| 6,606,588 B1 * | 8/2003 | Schaumont et al. | .......... | 703/15 |
| 6,930,516 B2 * | 8/2005 | Gabara | ........................ | 327/51 |
| 7,109,760 B1 * | 9/2006 | Lin | ............................. | 327/12 |
| 7,117,143 B2 * | 10/2006 | Wang et al. | .................. | 703/25 |
| 7,119,591 B1 * | 10/2006 | Lin | ............................. | 327/158 |
| 2002/0075048 A1 * | 6/2002 | Miyamoto | ................... | 327/158 |
| 2004/0135992 A1 * | 7/2004 | Munro | ...................... | 356/4.01 |
| 2004/0227554 A1 * | 11/2004 | Park | ............................ | 327/280 |
| 2006/0114040 A1 * | 6/2006 | Sasaki | ........................ | 327/161 |

FOREIGN PATENT DOCUMENTS

| JP | 11031948 A | * | 2/1999 |
|---|---|---|---|
| JP | 2002152018 A | * | 5/2002 |

* cited by examiner

*Primary Examiner*—Paul Dinh
*Assistant Examiner*—Helen Rossoshek
(74) *Attorney, Agent, or Firm*—William L. Botjer

(57) ABSTRACT

A method of simplifying a logic circuit for enabling cycle-by-cycle equivalence checking is provided. To accomplish this, first, a logic circuit is identified to be a variable delay circuit or a fixed delay circuit. If the logic circuit is a variable delay circuit, it is converted to a fixed delay circuit by using additional circuitry to obtain a fixed delay circuit. If the fixed delay circuit is a logic circuit that performs multiple cycle computations, it is converted to a logic circuit that performs the same computation in a single cycle. Circuit acceleration includes concatenating multiple copies of the fixed delay circuit. After performing circuit acceleration on all sub-circuits in the fixed delay circuit, a combined accelerated circuit is obtained. Thereafter, redundant flip-flops are identified and removed from the combined accelerated circuit and the combined accelerated circuit is optimized.

9 Claims, 11 Drawing Sheets

METHOD OF SIMPLIFYING A CIRCUIT FOR EQUIVALENCE CHECKING

BACKGROUND

The present invention relates to the field of computer-aided design of integrated circuits and, in particular, to testing the equivalence of digital logic circuits.

Recent increases in the complexity of modern integrated circuits (ICs) have made it imperative to verify design correctness prior to fabrication. The verification of design correctness, prior to fabrication, is essential because any design flaw detected after fabrication can have a severe economic impact in terms of increased time-to-market and reduced profit margins.

One of the main steps undertaken in verifying design correctness is that of equivalence checking between two logic circuit designs that belong to different development stages of designing the IC. Equivalence checking is performed using equivalence checkers, which are usually implemented in software. The equivalence checkers build mathematical models of the two logic circuit designs, and mathematically verify that the logics implemented by the two designs are the same. If an equivalence checker determines that the two circuit designs output the same values for a given input at a given point of time, then the two circuits are termed as equivalent to one another. Further, the circuits being tested for equivalence can be classified into two categories: combinational circuits and sequential circuits. A combinational circuit is a circuit whose output depends entirely on the values of the inputs to the circuit. A simple example of a combinational circuit is a series of interconnected AND gates, in which none of the outputs is fed back to the AND gates. A sequential circuit is a circuit whose output depends, in addition to input values, on the previous values of the sequential elements of the circuit. Therefore, a sequential circuit comprises one or more combinational circuits wherein the output values may be fed back to the combinational circuits via storage elements. The storage elements may be implemented by using flip flops, latches or registers.

There are many equivalence checking techniques and tools for equivalence checking in combinational circuits. The research paper titled 'Equivalence Checking Using Cuts and Heaps', by Andreas Kuehlmann and Florian Krohm, Proceedings of the 34th annual ACM IEEE conference on Design automation, pages: 263-268, describes one such approach. Another technique is described in research paper titled 'Combinational Equivalence Checking through Function Transformation', by Hee Hwan Kwak, InHo Moon, James H. Kukula and Thomas R. Shiple, Proceedings of the 2002 IEEE/ACM international conference on Computer-aided design, pages: 526-533. Examples of software tools used for combinational equivalence checking are Conformal LEC from Cadence Design Systems; Formality® from Synopsys, Inc; and FormalPro from Mentor Graphics.

Equivalence checking in the case of sequential circuits is relatively complex. This is because of the presence of storage elements, which are responsible for generating different sets of output values for the same set of input values. Two steps are performed to check the equivalence between two sequential circuits. In the first step, a mapping between the corresponding storage elements of the two circuits is performed. This step is also known as latch mapping or register mapping. Once the corresponding storage elements are identified, it is possible to decompose the circuits into various combinational blocks. Therefore, in the second step, the equivalence is determined by checking if the corresponding combinational blocks are equivalent.

There are many techniques in the art for performing the mapping of storage elements. One such technique has been described in U.S. Pat. No. 6,496,955, titled 'Latch Mapper' assigned to Sun Microsystems, Inc., Santa Clara, Calif. Another technique is mentioned in U.S. Pat. No. 6,247,163, titled 'Method and System of Latch Mapping for Combinational Equivalence Checking', assigned to Cadence Design Systems, Inc., San Jose, Calif. However, these techniques are not failsafe and may fail in complex sequential circuits, which involve a large number of storage (or memory) elements. Further, in some commercially available tools, there is the requirement of one-to-one latch mapping between the two circuits being compared. In these tools, the correspondence between the storage elements must be provided by the user of the tool.

In light of the above discussion, there is a need for a method that makes the task of equivalence checking in sequential circuits simpler and more effective. A need also exists for a method that reduces or minimizes the number of storage elements in a sequential circuit, so that equivalence checking is made easier.

SUMMARY

An object of the invention is to simplify and optimize a logic circuit for enabling circuit equivalence checking.

Another object of the invention is to convert a variable delay circuit to a fixed delay circuit by using additional circuitry.

Another object of the invention is to convert a multi-cycle fixed delay circuit to a single cycle fixed delay circuit by means of circuit acceleration.

Another object of the invention is to obtain a combined accelerated circuit, determined from one or more accelerated sub-circuits.

Yet another object of the invention is to identify and remove redundant flip-flops from a combined accelerated circuit.

To achieve the above-mentioned objectives, a method of simplifying a logic circuit for enabling cycle-by-cycle equivalence checking has been provided. According to the method, it is first identified whether the logic circuit is a variable delay circuit or a fixed delay circuit. If the logic circuit is a variable delay circuit, it is converted to a fixed delay circuit by using an additional circuitry. If the fixed delay circuit is a logic circuit that performs multiple cycle computations, it is converted to a logic circuit that performs the same computation in a single cycle. This conversion of a logic circuit from multiple cycle behavior to single cycle behavior is called circuit acceleration. Circuit acceleration involves the concatenation of multiple copies of the fixed delay circuit. After performing circuit acceleration on all sub-circuits in the fixed delay circuit, a combined accelerated circuit is obtained. Thereafter, redundant flip-flops are identified and removed from the combined accelerated circuit, and the combined accelerated circuit is optimized. The resulting circuit is a simplified circuit.

DESCRIPTION OF THE VARIOUS EMBODIMENTS

Figure 1:
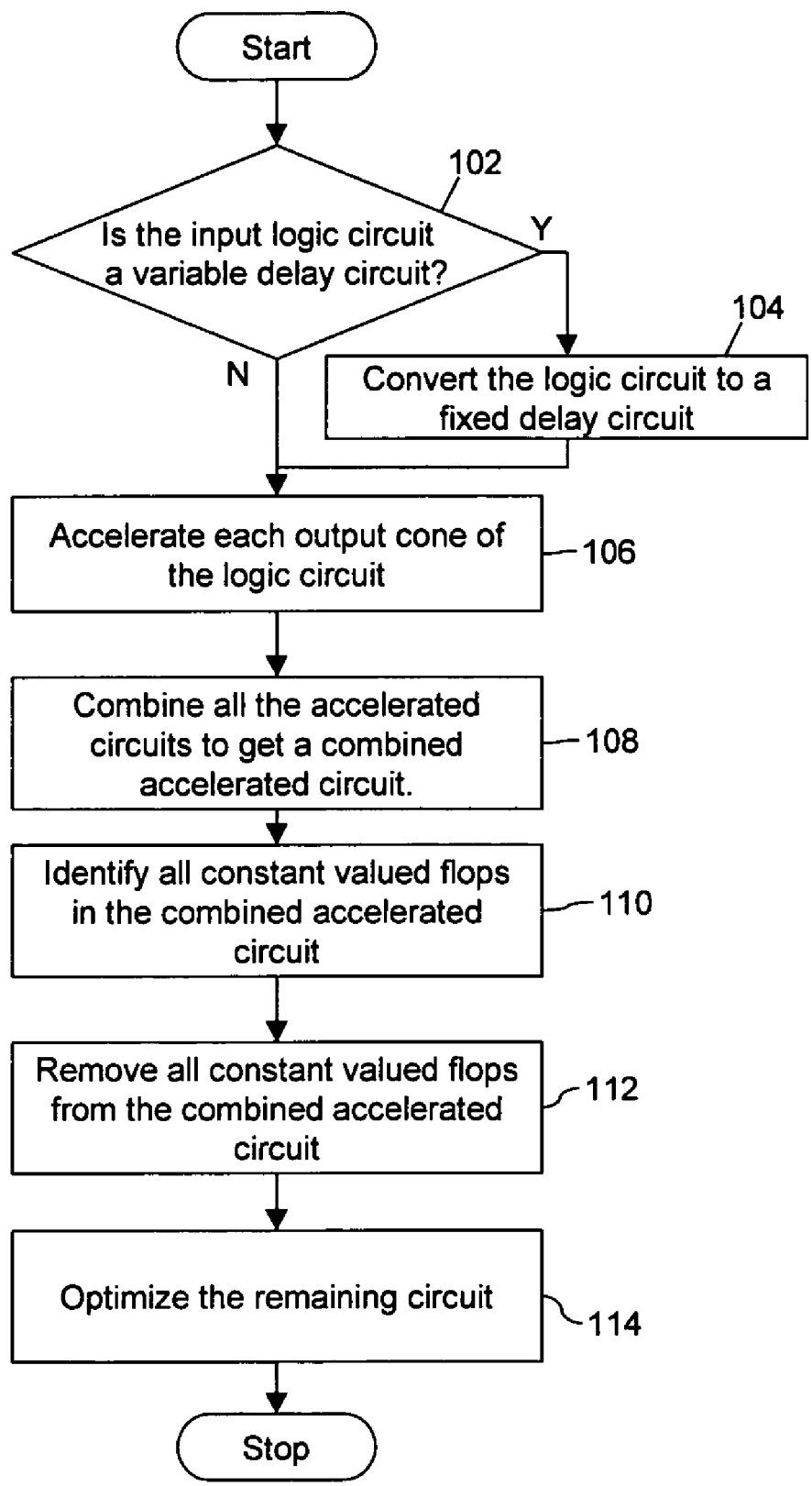
FIG. 1 is a flowchart illustrating the steps of the invention, according to an exemplary embodiment of the invention.

For the sake of convenience, terms that have been used to describe the various embodiments are defined below. It is to be noted that these definitions are provided merely to aid the understanding of the description, and are in no way to be construed as limiting the scope of the invention.

The term "Logic Circuit" signifies a digital circuit with one or more inputs and outputs, which can include one or more logic gates and sequential circuit elements. The logic circuit can be modeled in a computer system using a hardware description language such as Verilog HDL or VHSIC Hardware Description Language (VHDL). VHSIC is an acronym for Very High-Speed Integrated Circuits. These hardware description languages can be used to model a logic circuit at many levels of abstraction ranging from the algorithmic level to the gate level.

The term 'Register Transfer Level' or RTL signifies a high level description of a logic circuit. RTL is used to describe the registers of a computer or digital electronic system using variables and data operators, and the way in which data is transferred between them. For example, in the RTL, a simple digital circuit performing an AND operation may be described as "OUT=a&b," where "&" represents the AND operation between the variables a and b, and OUT represents the output of the digital circuit.

The term "Throughput" is defined as the rate at which a logic circuit produces a particular valid output. For example, if a particular output in a logic circuit produces a valid output every 2 clock cycles, it is said to have a throughput of 0.5.

The term "System Level Representation" signifies a high level representation of a logic circuit showing the essential functional components required for the working of the logic circuit.

The term 'Register Transfer Level Representation' or 'RTL Representation' signifies a representation of a logic circuit using registers (storage elements) and logic gates/elements.

The term "Output Cone" signifies a sub-circuit responsible for generating a particular output, where the output is input to a register or is a primary output.

The term "Fixed Delay Circuit" signifies a logic circuit in which valid outputs have a constant throughput.

The term "Variable Delay Circuit" signifies a logic circuit in which the throughput is not constant and depends on the inputs.

The term "Circuit Acceleration" signifies a circuit transform for converting a logic circuit that performs a desired functionality in multiple clock cycles to a logic circuit that performs the functionality in a single clock cycle.

The term "Constant Valued Flip-flops" signifies the flip-flops in a logic circuit that do not change their values in any of the clock cycles.

The term "multiple cycle logic circuit" or "multi cycle logic circuit" refers to a logic circuit that provides an output in multiple clock cycles.

The term "single cycle logic circuit" refers to a logic circuit that provides an output in a single clock cycle.

The present invention provides a method of simplifying a circuit for equivalence checking. In general, two or more logic circuits can be used to implement the same functionality. The logic circuit implementations may differ as far as the number and type of circuit elements and the number of cycles for the generation of a valid output are concerned. Further, the use of a different number of flip-flops and different throughputs make cycle-by-cycle equivalence checking difficult to perform. Therefore, it is essential to simplify any two logic circuits, which are to be compared, so that they have the same throughput, thereby making equivalence checking easier. The simplification of a logic circuit should, therefore, achieve two aims—removing redundant flip-flops from the logic circuit and increasing the throughput of the resulting circuit to one.

The present invention achieves circuit simplification by first performing circuit acceleration (or acceleration) on the logic circuits to be compared, and then removing those flip-flops that have a constant value during the operation of the accelerated logic circuit. The circuit acceleration can be performed by combining multiple 'copies' of the combinational portion of the same circuit in series. Once the logic circuit has been accelerated, the constant valued flip-flops are identified and removed in the accelerated circuit. Thereafter, the logic circuit can be simplified by using known techniques such as dead code elimination. Afterwards, the logic circuit can be compared for cycle-by-cycle equivalence checking, using techniques known in the art.

The present invention performs circuit simplification in fixed-delay RTL representations as well as variable-delay RTL representations. The above-described method is used for a fixed-delay RTL representation. In the case of a variable-delay RTL representation, the variable-delay representation is first converted to a fixed-delay representation by using additional circuitry. The total number of clock cycles used by the new fixed-delay representation is the same as the maximum number of clock cycles required by the original representation. Thereafter, the above-described method is used for equivalence checking.

FIG. 1 is a flowchart illustrating the steps of the invention according to an embodiment of the invention. At step 102, a logic circuit is checked to find out whether the input logic circuit is a variable delay circuit or a fixed delay circuit. This information is usually provided in the specifications of the circuit design and can be checked by a user or a computing system that implements the present invention. If the logic circuit is a variable delay circuit, then at step 104, the logic circuit is converted to a fixed delay circuit by using additional circuitry. The additional circuitry comprises a handshake module and an output module. These are described later in the description in conjunction with FIG. 8a and FIG. 8b. If the logic circuit is a fixed delay circuit, or if the logic circuit is a variable delay circuit converted to a fixed delay circuit, as in step 104, then each output of the logic circuit is accelerated so as to convert the multiple cycle logic circuit to a single cycle logic circuit. This process can involve the acceleration of the different parts of the logic circuit by differing amounts. This is explained in more detail in the following paragraphs.

In general, a logic circuit may have one or more outputs for the same set of inputs, with some outputs being variable delay and others fixed delay. Further, the fixed delay outputs may each have different delays (or throughputs). That is, they provide a valid output in a differing number of clock cycles. Therefore, all the outputs, and the corresponding output cones, of the logic circuit need to be analyzed for their throughput. When the logic circuit has more than one fixed delay outputs with different throughputs, the outputs of the logic circuit are segregated on the basis of the throughputs. Outputs having the same throughputs require the same amount of acceleration. For example, if an output O1 is produced every two cycles and an output O2 is valid every three cycles, then the sub-circuit producing O1 (the logic cone of O1) needs to be accelerated by a factor of two (two combinational copies concatenated) and the logic cone of O2 by a factor of three. Thereafter, the resulting accelerated logic cones are placed together to construct the full accelerated circuit. Acceleration in the manner described above is performed at step 106.

After all the logic cones have been accelerated, the accelerated logic cones are combined to obtain a combined accelerated circuit at step 108. Subsequently, at step 110, all the constant valued flip-flops in the combined accelerated circuit are identified. The constant valued flip-flops can be identified by using a method called iterative relaxation. The process of iterative relaxation comprises the following steps:

STEP 1: Initialize a RESET list that includes the flip-flops with known reset values in the accelerated logic circuit;

STEP 2: Start all flip-flops in the accelerated logic circuit. The flip-flops in the reset list start with their reset values, and the other flip-flops are treated as free variables;

STEP 3: Compute the next state equations of these flip-flops. Check if these equations simplify to their reset values;

STEP 4: Identify a subset of flip-flops in the RESET list, which do not reach reset values;

STEP 5: If this subset is empty then GO TO STEP 7;

STEP 6: Remove the flip-flops (belonging to the subset) from the RESET list, and GO TO STEP 2; and STEP 7: The remaining flip-flops in the RESET list are constant valued flip-flops.

At step 112, all the constant valued flip-flops in the combined accelerated circuit are removed. The process of removing the constant valued flip-flops leaves some hanging wires in the circuit (that is, some unconnected wires). These hanging wires are removed and the circuit is optimized at step 114 using known techniques such as constant propagation and dead code elimination. Constant propagation is a technique that checks whether the supply of constant inputs results in constant outputs. Dead code elimination is a technique of identifying and removing open ended wires from a circuit.

The working of the invention for the fixed delay case is now discussed in detail with the help of an example of a system-level representation and an RTL representation having the same functionality.

Figure 2B:
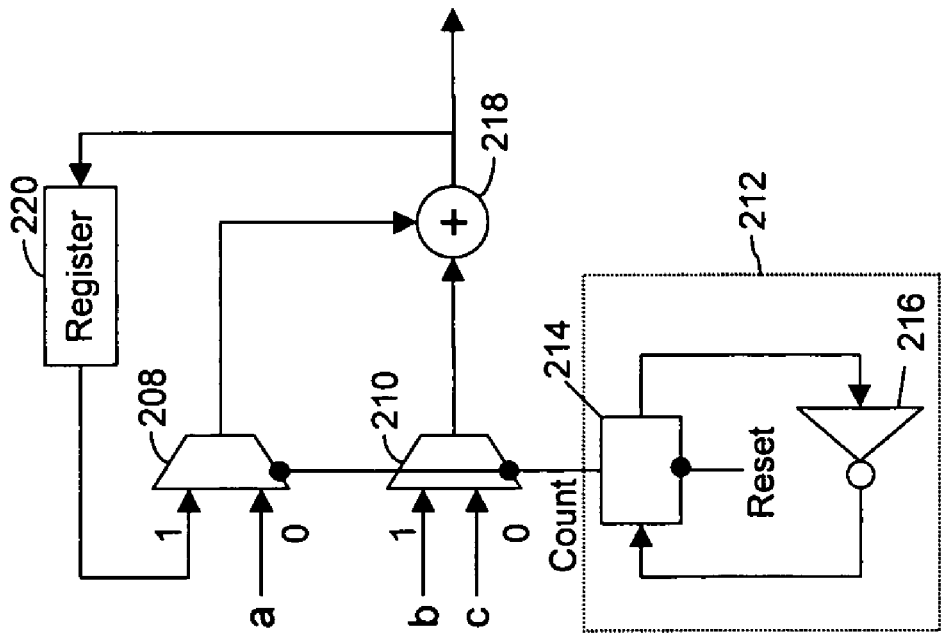
FIG. 2b is a Register Transfer Level (RTL) representation of a logic circuit for adding three numbers.
Figure 2A:
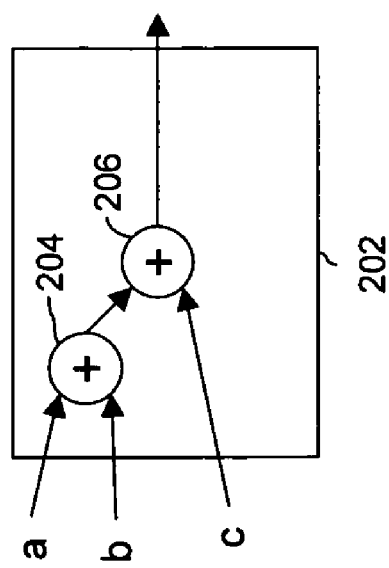
FIG. 2a is a system-level representation of a logic circuit for adding three numbers.

FIG. 2a is a system-level representation of a logic circuit for adding three numbers. The inputs to a three-number adder 202 are three N-bit numbers 'a', 'b' and 'c'. Adder 204 is an N-bit adder that can result in a maximum of (N+1) bit output. The numbers 'a' and 'b' are inputs to adder 204. The result of this computation is then input to adder 206, which is an (N+1) bit adder plus a carry. Adder 206 adds the number 'c' and output of adder 204. As is apparent, this is a generalized scheme for any logic circuit adding three numbers. However, the RTL implementation can be done in several ways. Each of these implementations can involve a different number of sequential and combinational circuit elements. The invention aims to enable circuit equivalence checking between any two such implementations.

FIG. 2b is a Register Transfer Level (RTL) representation of a possible logic circuit for adding three numbers. This RTL implementation performs the addition of three N-bit numbers, 'a', 'b' and 'c', in two clock cycles. First multiplexer 208 and second multiplexer 210 are N bit, two-to-one multiplexers that choose one of the two inputs, and pass it to the output, depending on the value of the select signal 'Count'. 'Count' is generated by means of a one-bit counter 212. One-bit counter 212 is implemented by using a delay flip-flop 214 followed by a NOT gate 216, as shown in FIG. 2b. When 'Count' is 0, the input corresponding to 0 is chosen as the output by first multiplexer 208 and second multiplexer 210; and when 'Count' is 1, the input corresponding to 1 is chosen as the output by first multiplexer 208 and second multiplexer 210. Adder 218 adds the outputs of first multiplexer 208 and second multiplexer 210. The output of adder 218 is stored in a register 220 that is of the same number of bits as adder 218. The working of the logic circuit in FIG. 2b is described hereinafter.

First, all memory storage elements, that is, delay flip-flop 214 and register 220 are initialized to zero. Thereafter, one-bit counter 212 starts counting. The values of the numbers 'a', 'b' and 'c' are supplied at the inputs. When the value of 'Count' is 0, adder 218 performs the addition of 'a' and 'c' and the sum is stored in register 220. In the next clock cycle, the value of 'Count' is 1. Now, the input number 'b' and the value stored in register 220 are passed as inputs to adder 218. The result of this computation, which is the sum of all three numbers 'a', 'b' and 'c', is available as a valid output. This computation takes two clock cycles. Therefore, the throughput of this logic circuit is one valid output per two clock cycles. This logic circuit can be accelerated by concatenating two copies of the logic circuit together.

Figure 3:
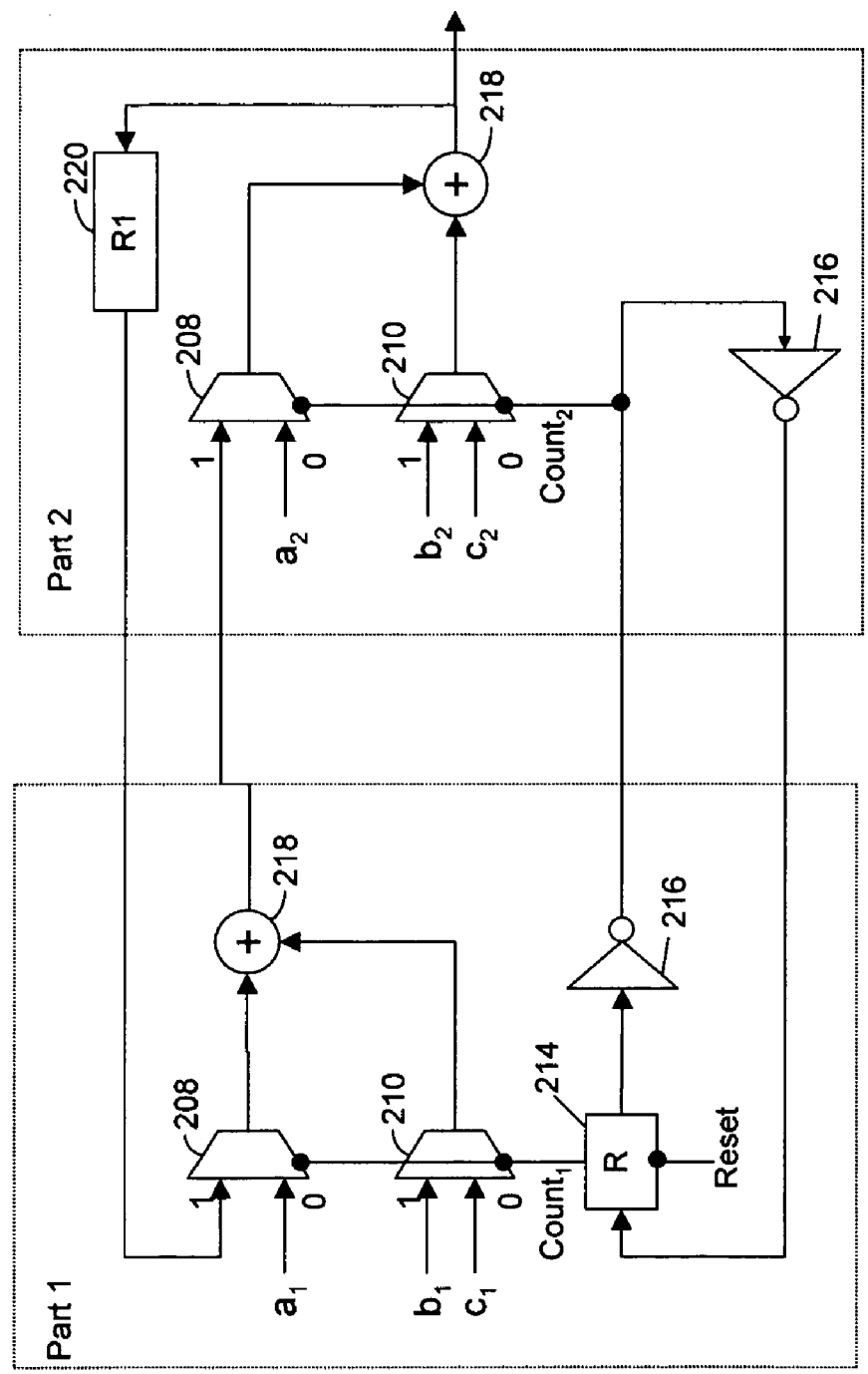
FIG. 3 illustrates an accelerated version of the logic circuit for adding three numbers determined from the RTL representation.

FIG. 3 illustrates an accelerated logic circuit derived from the RTL implementation of logic circuit for adding the three numbers shown in FIG. 2b. Accelerated logic circuit 301 has a throughput of one valid output per clock cycle. Accelerated logic circuit 301 is divided into two parts—Part 1 and Part 2. The outputs of Part 1 are inputs to Part 2. The working of accelerated logic circuit 301 is described hereinafter.

First, all memory storage elements, that is, delay flip-flop 214 and register 220 are initialized to zero. Thereafter, one-bit counter 212 starts counting. The values of the numbers '$a_1$', '$b_1$' and '$c_1$' are supplied at the inputs of Part 1. Similarly, the values of the numbers '$a_2$', '$b_2$' and '$c_2$' are supplied at the inputs of Part 2. The values of '$a_1$', '$b_1$', and 'c1' are equal to '$a_2$', '$b_2$', and '$c_2$' respectively. When the value of '$Count_1$' is 0, adder 218 performs the addition of '$a_1$' and '$c_1$' and the sum is transferred to next multiplexer 208. Further, 'Count$_2$' is 1. Therefore, multiplexer 208 in Part 2 selects the output of adder 218 in Part 1 and 'b$_2$'. The result of this computation is stored in register 220 and is also available at the output of Part 2. Therefore, compared to the logic circuit described in FIG. 2b, accelerated logic circuit 301 computes the addition of three numbers in a single cycle.

Figure 4A:
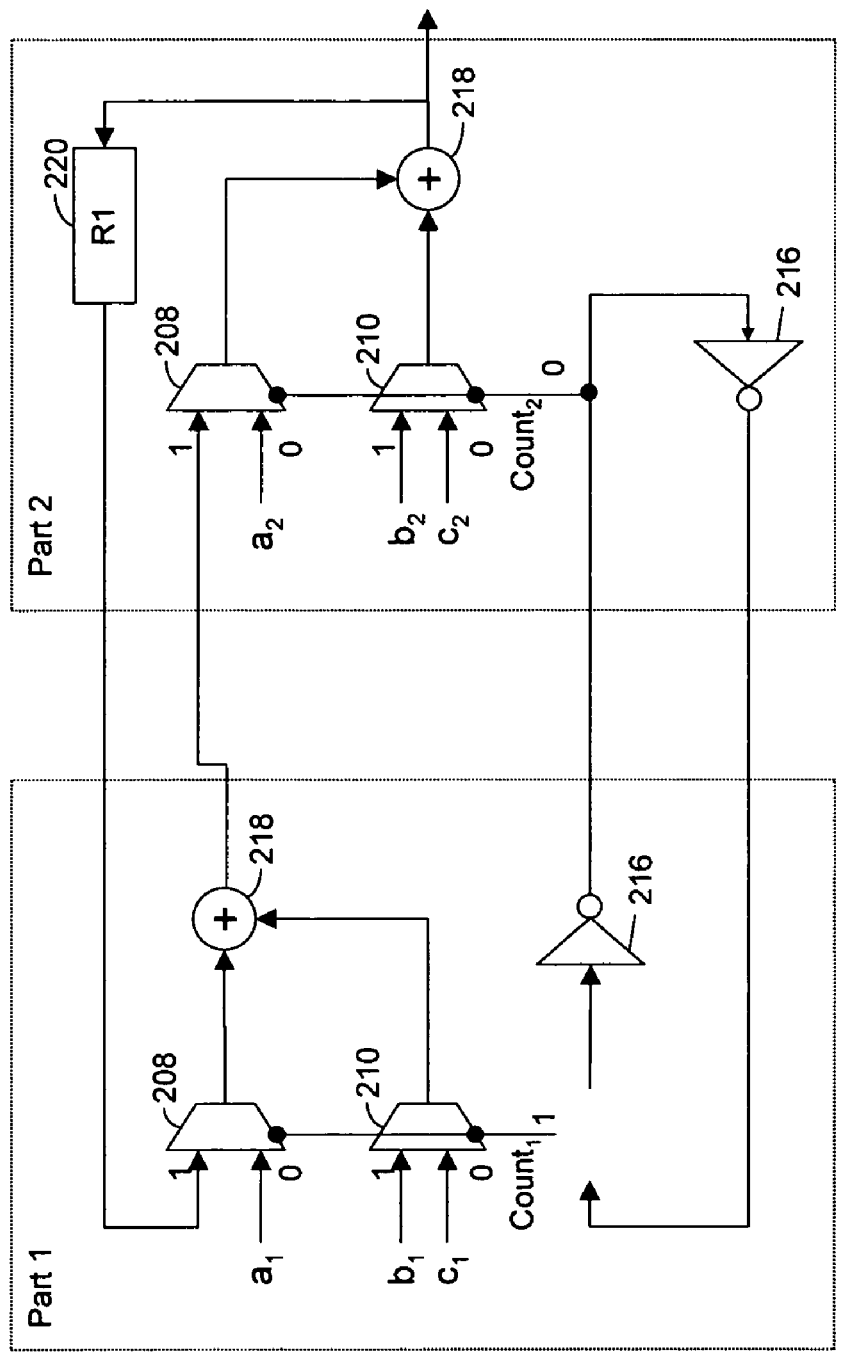
FIGS. 4a-4c illustrate the different states of a simplified logic circuit obtained after circuit acceleration and the removal of redundant flip-flops from the accelerated circuit of FIG. 3.

Identification and Removal of Constant Flip-Flops:

There are two flip-flops, flip-flops 214 and 220, in accelerated circuit 301. Initializing these flip-flops to their reset states, the next states of these flip-flops are calculated. One may note that the value of delay flip-flop 214 always remains zero due to the action of invertors 216. On the other hand, the value of flip-flop 220 changes from reset value to the state equation a1+b2+c1. Hence, the delay flip-flop is a constant valued flip-flop, and can be removed from the circuit. This is shown in FIG. 4a.

Figure 4B:
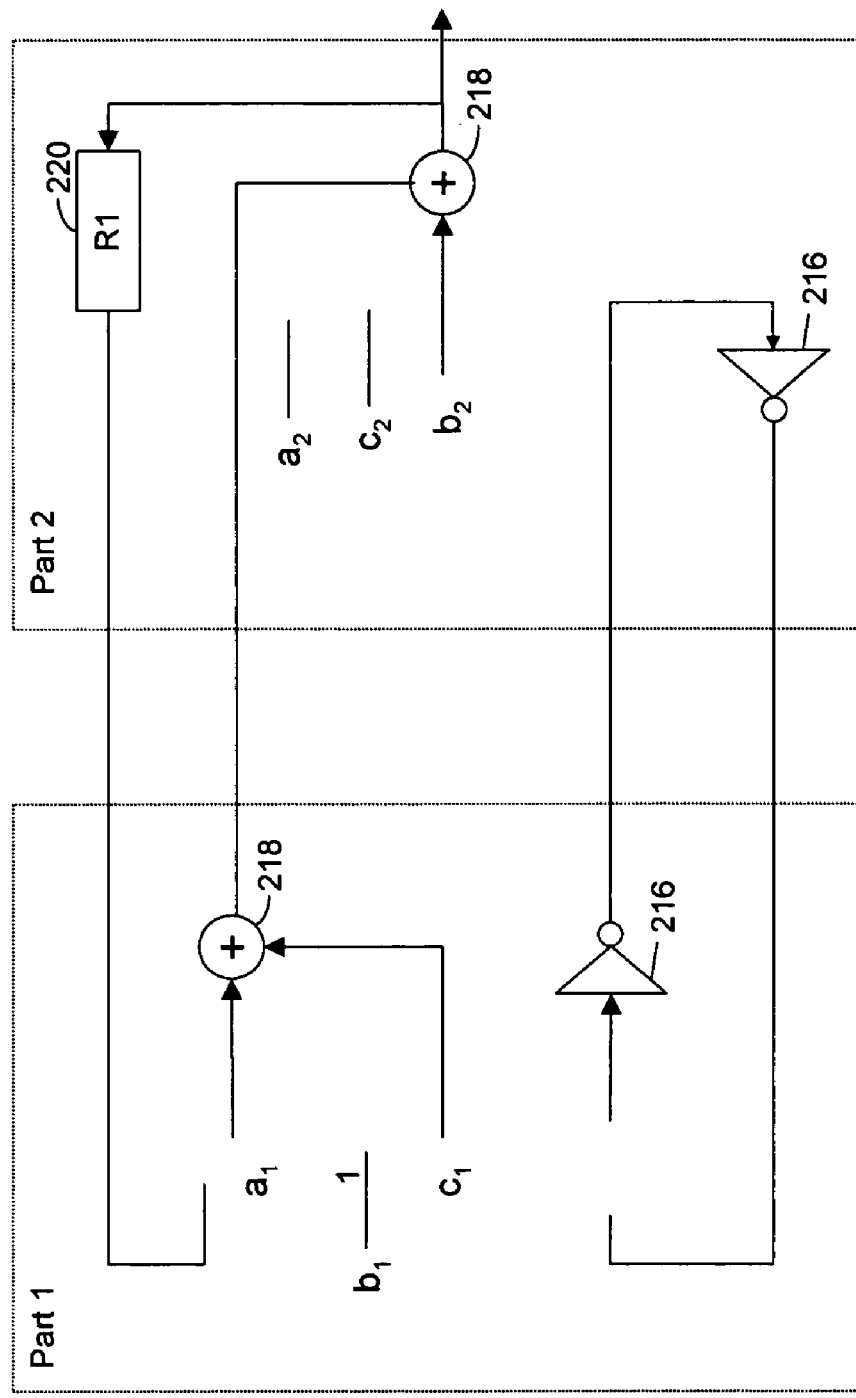

Optimization of Circuit:

Since delay flip-flop 214 has a constant value, first multiplexer 208 and second multiplexer 210 in Part 1 always select the input corresponding to 0. Similarly, first multiplexer 208 and second multiplexer 210 in Part 2 always select the input corresponding to 1. Therefore, first multiplexer 208 and second multiplexer 210 in Part 1 and Part 2 can be removed, while retaining only relevant components in the accelerated logic circuit. This is shown in FIG. 4b. At the same time, register 220 is redundant since the value it stores is never used. Therefore, register 220 can also be removed. This is shown in FIG. 4b.

Figure 4C:
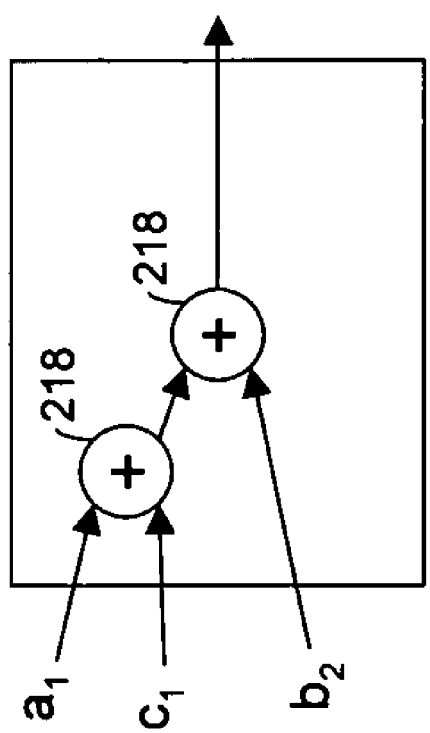

After removing all the redundant components, there are hanging wires in the logic circuit, as shown in FIG. 4b. The hanging wires are wires that are not connected to circuit elements on both ends. These can be removed by using standard circuit optimization techniques such as dead code elimination. After performing circuit optimization, using known techniques such as dead code elimination, a simplified logic circuit, as depicted in FIG. 4c is obtained. This logic circuit does not involve any redundant flip-flops and can be used by standard equivalence checkers to check circuit equivalence.

The working of the invention for a variable delay circuit is described in the following paragraphs.

Figure 5:
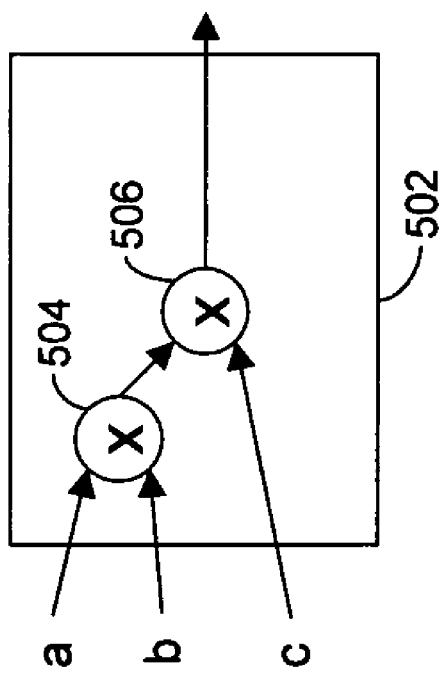
FIG. 5 is a system-level representation of a logic circuit that multiplies three numbers.

FIG. 5 illustrates a system-level representation of a logic circuit that multiplies three numbers. A three-input multiplier 502 multiplies three numbers, 'a', 'b' and 'c', the inputs being N-bit numbers. Three-input multiplier 502 comprises an N-bit by N-bit multiplier, multiplier 504 and a 2N-bit by N-bit multiplier (multiplier 506) that results in an output of maximum size 3N. In three-input multiplier 502, the numbers 'a' and 'b' are multiplied first by multiplier 504, and the product is multiplied by 'c' to get the product of the numbers 'a', 'b' and 'c'. As is apparent, this is a generalized scheme for any logic circuit multiplying three numbers. However, the RTL implementation for the same logic circuit can be carried out in several ways. Each of these implementations can involve a different number of sequential and combinational circuit elements.

Figure 6:
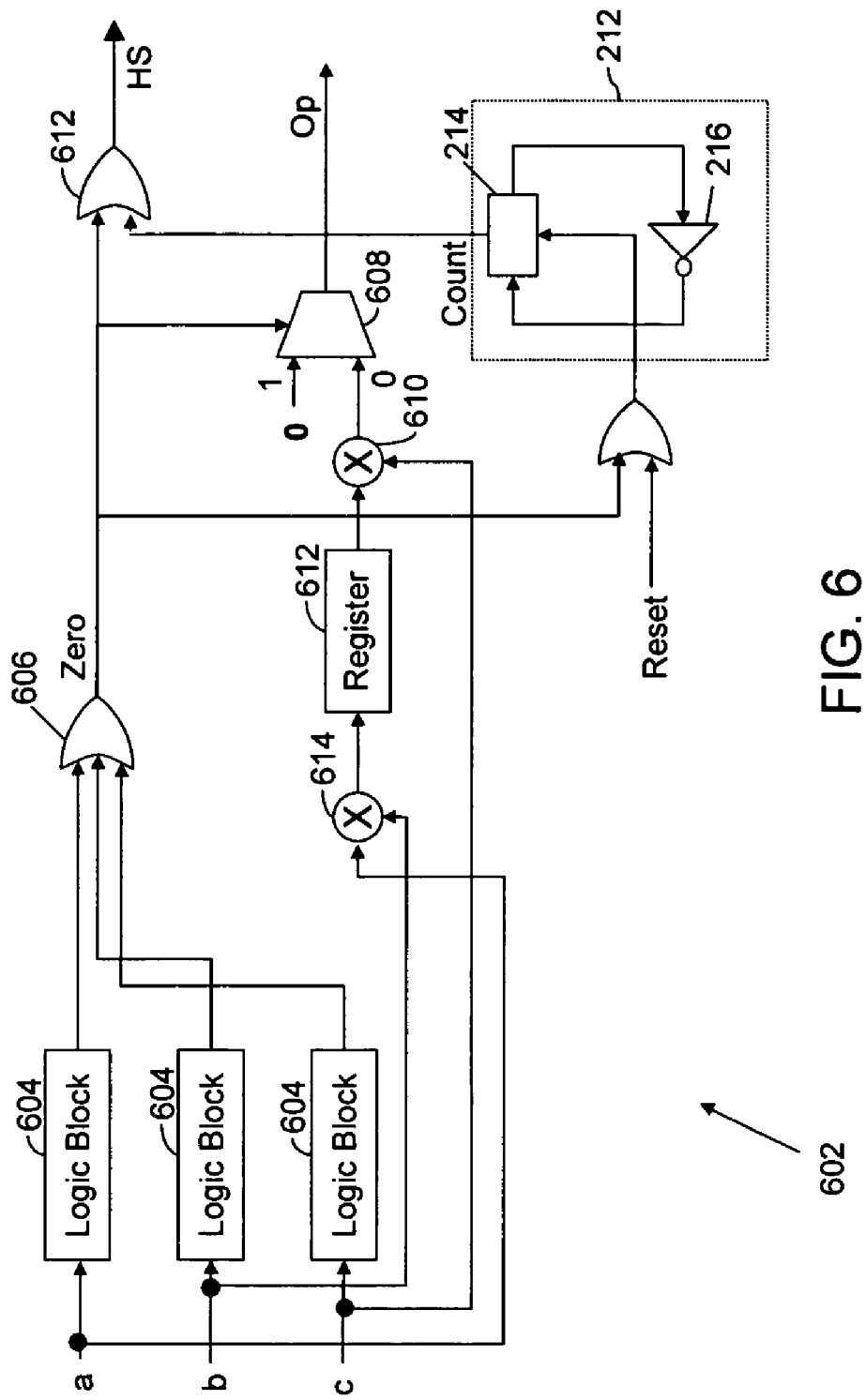
FIG. 6 is a RTL representation of a variable delay logic circuit that multiplies three numbers.

FIG. 6 illustrates a possible Register Transfer Level (RTL) representation of a variable delay logic circuit that multiplies three numbers. A three-input multiplier 602 multiplies three numbers, 'a', 'b' and 'c', the inputs being N-bit numbers. Logic block 604 is a logic circuit whose output is 1 if the input number equals 0, and the output is 0 otherwise. The output of all logic blocks 604 is input to a three-input OR gate 606. The output of three-input OR gate 606 is labeled 'Zero'. 'Zero' is 1 if any of the inputs is 0, and 0 otherwise.

A multiplexer 608 is a 3N bit, two-to-one multiplexer that chooses one of the two inputs and passes it to the output depending on the value of the select signal 'Zero'. The output of multiplexer 608 corresponding to 1 is a zero. The output of multiplexer 608 corresponding to 0 is the output of a multiplier 610. Therefore, when 'Zero' is 1, multiplexer 608 selects the input corresponding to 1, that is, the output 'Op' is a zero, as it should be. Further, 'Zero' is an input to a two-input OR gate 612, the output of which is a handshake signal, represented by 'HS'. The other input is 'Count', which is generated by one-bit counter 212. The value of 'HS' equal to 1 implies that the computation is complete and the value of 'Op' is a valid output. The value of 'HS' equal to 0 implies that the computation is not complete and the output 'Op' may not be valid. Therefore, when at least one of the inputs is zero, the actual multiplication does not need to be performed and a valid output is available at 'Op' in one cycle only.

In the case where none of the inputs is zero, the value of 'Zero' is 0. The numbers 'a' and 'b' are input to a 2N bit multiplier, multiplier 614. The result of the computation performed by multiplier 614 is stored in register 612. In the next clock cycle, multiplier 610 performs multiplication of the value stored in register 612 and 'c'. In the second clock cycle, the value of 'Count' is 1 and the 'HS' signal becomes 1. Further, the value of 'Zero' is 0, therefore, multiplexer 608 selects the input corresponding to value 0, that is, the output of multiplier 610. Therefore, the value of 'Op' is now the valid product of the three input numbers. In this case, the computation is performed in two clock cycles. As is seen from the two cases given above, three-input multiplier 602 is a variable delay circuit whose throughput depends on the values of the inputs.

To convert a variable delay circuit, such as three-input multiplier 602, to a fixed delay circuit, an additional circuitry is required. The additional circuitry is described below.

Figure 7:
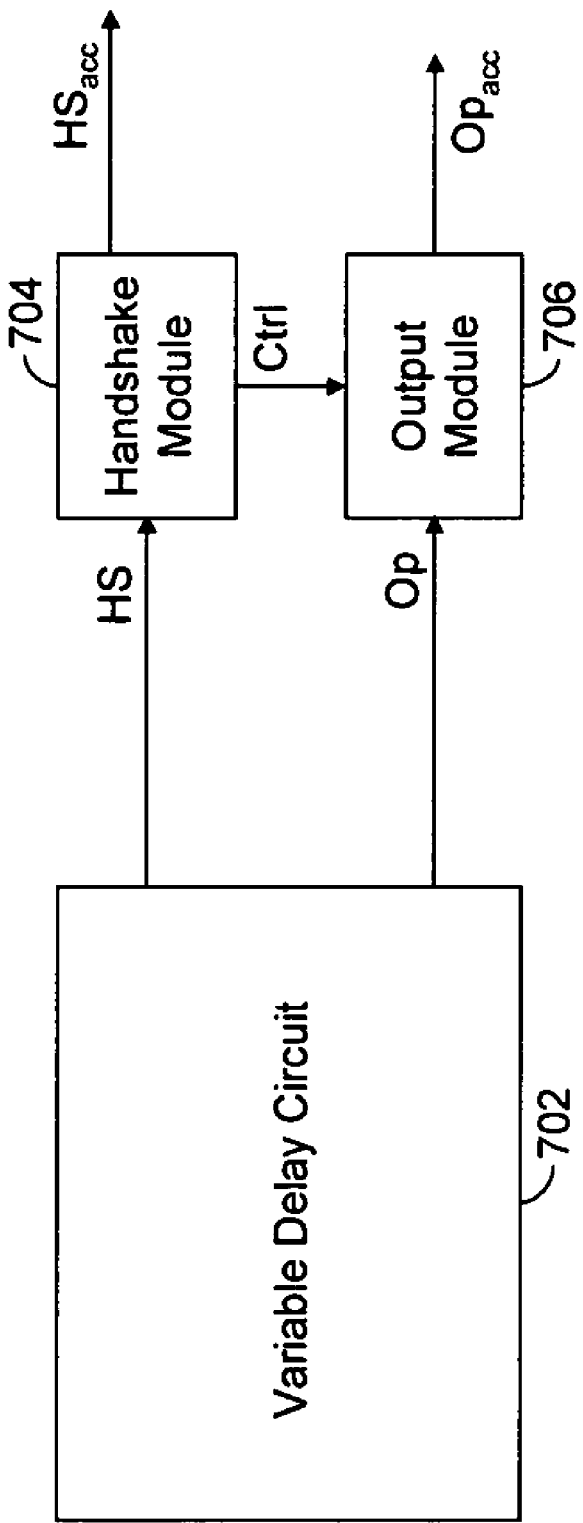
FIG. 7 is a block diagram showing a fixed delay circuit achieved after using additional blocks—a Handshake module and an Output Module, in a variable delay circuit.

FIG. 7 is a block diagram showing a fixed delay circuit achieved after using additional blocks—a handshake module and an output module, in a variable delay circuit 702. Variable delay circuit 702 is any variable delay circuit whose throughput depends on the values of one or more of its inputs. The outputs of variable delay circuit 702 are a handshake signal represented by 'HS' and the result of the computation represented by 'Op'. It should be noted here that variable delay circuit 702 is shown to have only a single output 'Op'. In general, there can be one or more outputs. And the method described below is then performed for each of the outputs taken separately. The handshake signal 'HS' is input to a handshake module 704. Outputs of handshake module 704 are an accelerated handshake signal represented by 'HS$_{acc}$' and a control signal represented by 'Ctrl'. The output signal 'Op' and control signal 'Ctrl' are inputs to an output module 706. The output of output module 706 is an accelerated output signal 'Op$_{acc}$'. 'HS$_{acc}$' has value 1 if the value of the accelerated output signal 'Op$_{acc}$' is a valid output and 0 otherwise. Exemplary implementations of handshake module 704 and output module 706 are described below.

Figure 8B:
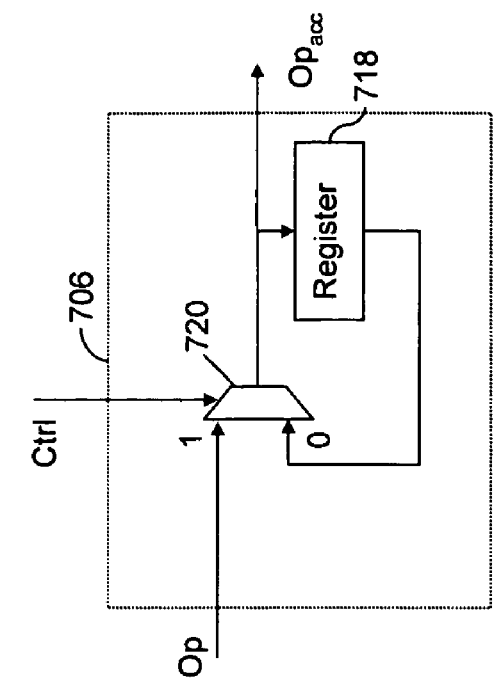
FIG. 8b illustrates an exemplary implementation of the output module, according to an embodiment of the invention.
Figure 8A:
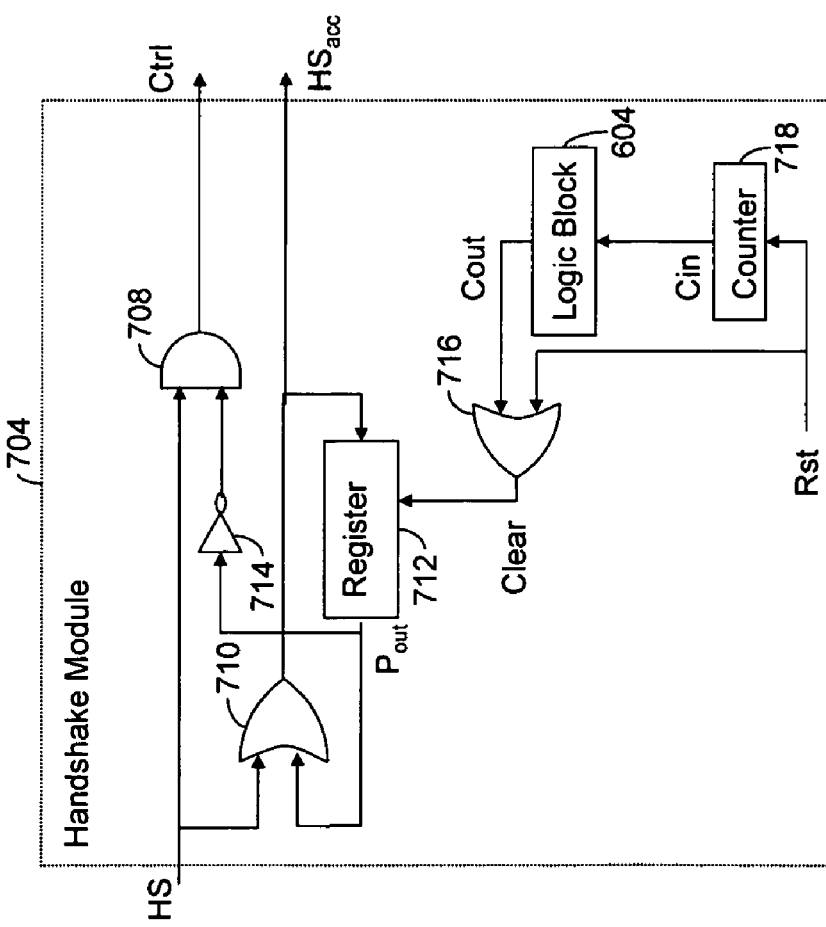
FIG. 8a illustrates an exemplary implementation of the handshake module, according to an embodiment of the invention.

FIG. 8a illustrates an exemplary implementation of handshake module 704 according to an embodiment of the invention. 'HS' is input to a two-input AND gate 708 and a two-input OR gate 710. The output of two-input OR gate 710 is HS$_{acc}$. Further, the output of two-input OR gate 710 is input to a 1-bit register, register 712. Output of register 712 is represented by 'P$_{out}$'. 'P$_{out}$' is input to two-input OR gate 710 and a NOT gate 714. The output of NOT gate 714 is the second input to two-input AND gate 708. The output of two-input AND gate 708 is the 'Ctrl' signal. In addition to this, a 'Clear' signal is generated to make register 712 reset to 0. 'Clear' is generated by a two-input OR gate 716, the inputs to which are an 'Rst' signal and a 'Cout' signal. Logic block 604 generates 'Cout' with 'Cin' as input. When 'Cin' is zero, 'Cout' is 1 and 0 otherwise. A counter 718 generates 'Cin'. Counter 718 counts from 0 to ($L_{max}$–1) where $L_{max}$ is the maximum number of cycles taken by variable delay circuit 702 to produce a valid output.

FIG. 8b illustrates an exemplary implementation of output module 706 according to an embodiment of the invention. 'Op' is input to a two-to-one multiplexer, multiplexer 720, corresponding to the case when 'Ctrl' is 1. The output of multiplexer 720 is the accelerated output '$Op_{acc}$', which is also stored in a register of suitable size, register 722. Register 722 also forms an input to multiplexer 720 corresponding to the case when 'Ctrl' is 0.

Figure 9:
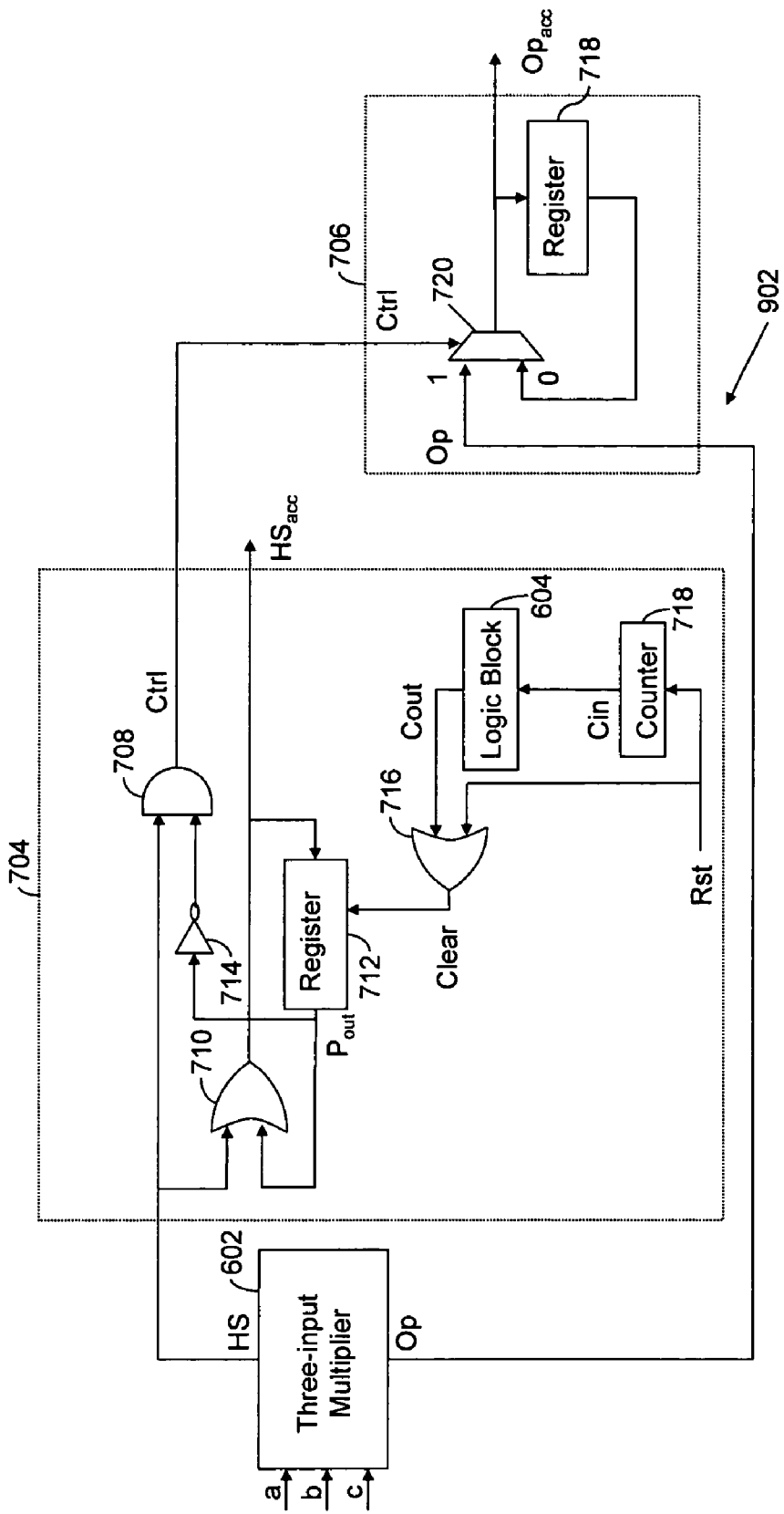
FIG. 9 illustrates a fixed delay circuit for multiplying three numbers achieved after using additional blocks—the handshake module and the output module.

FIG. 9 illustrates a fixed delay circuit for multiplying three numbers achieved after using additional blocks— handshake module 704 and output module 706 in three-input multiplier 602. Due to space constraints, three-input multiplier 602 is shown in FIG. 9 as a block diagram. The details and labels used in this description are the same as those provided in conjunction with FIG. 6. The functioning of fixed delay multiplier 902 determined, as in FIG. 9, is discussed now.

As discussed previously in conjunction with FIG. 6, three-input multiplier 602 produces a valid output 'Op' in a single clock cycle when one or more of the three inputs is zero. Otherwise, a valid output is produced in two cycles. With the use of additional circuitry as described in FIG. 7 and FIG. 8, fixed delay multiplier 902 has a valid output at '$Op_{acc}$' after every two clock cycles. In addition to this, the inputs are held for two clock cycles before the next set of inputs can be applied. In this case, counter 718 counts till 2 (that is, 0 and 1 alternately). Further, it should be noted that the reset signal to all flip-flops takes precedence over other signals. That is, whenever reset signals 'Rst', 'Zero' and 'Clear' are 1, the corresponding flip-flop or register is reset to 0. The working of three-input multiplier 602 with the values of different signals in different clock cycles is described in the following table.

'$Op_{acc}$' is 0, which is the correct output. Also, after two clock cycles, that is, at T=1, '$Op_{acc}$' is 0. Therefore, a valid output is available at the end of two clock cycles.

At clock cycle T=2, the inputs to three-input multiplier 602 are changed so that none of the inputs is zero. At clock cycle T=3, it should be noted that '$HS_{acc}$' is 1, which implies that '$Op_{acc}$' is a valid output. Further, the value Of '$Op_{acc}$' is M, which is the product of the three input numbers. Again, in this case, a valid output is available at the end of two clock cycles. Therefore, three-input multiplier 602 behaves like a fixed delay circuit, giving a valid output every two clock cycles.

The method and system described above to convert variable delay circuit 702 to a fixed delay circuit can be performed, in general, for logic circuits with any throughput. The mathematical description for the same is given below. The same can also be derived from FIG. 8a and FIG. 8b.

For variable delay circuit 702 producing a valid output in a maximum of $L_{max}$ cycles, the following analysis holds:

$$HS_{acc}(n)=HS_{acc}(n-1)|HS(n)=HS(0)|HS(1)|\ldots HS(n) \quad (1)$$

where:
HS(n), $HS_{acc}$(n) and Ctrl(n) are the values of 'HS' and '$HS_{acc}$' and 'Ctrl' signals respectively, at the (n+1)th clock cycle; and 'n' is an integer such that $0 \leq n \leq L_{max}$; and
the operator '|' denotes logical OR operation.

$$Ctrl(n)=\sim HS_{acc}(n-1)\&HS(n)=\sim HS(0)\&\sim HS(1)\&\ldots \sim HS(n-1)\&HS(n) \quad (2)$$

where:
HS(n), $HS_{acc}$(n) and Ctrl(n) are the values of 'HS' and '$HS_{acc}$' and 'Ctrl' signals respectively, at the (n+1)th clock cycle; and 'n' is an integer such that $0 \leq n \leq L_{max}$;
the operator '~' denotes logical NOT operation; and
the operator '&' denotes logical AND operation.

$$Op_{acc}(n)=Ctrl(n)?Op(n):Op_{acc}(n-1)=Ctrl(n)?Op(n):(Ctrl(n-1)?Op(n-1):(\ldots(Ctrl(0)?Op(0):F_{init})\ldots)) \quad (3)$$

where:
the logic $Op_{acc}$(n)=Ctrl(n)?Op(n):$Op_{acc}$(n–1) implies that $O_{pacc}$(n) gets the value Op(n) if Ctrl(n) is 1 and the value $Op_{acc}$(n–1) if Ctrl(n) is 0; and

TABLE 1

| Clock | Reset | Zero | Op | Count | HS | $HS_{acc}$ | Ctrl | $Op_{acc}$ | Cout | Clear | $P_{out}$ |
|---|---|---|---|---|---|---|---|---|---|---|---|
| T = –1 | 1 | X | X | X | x | X | x | x | x | 1 | x |
| T = 0 | 0 | 1 | 0 | 0 | 1 | 1 | 1 | 0 | 0 | 0 | 0 |
| T = 1 | 0 | 1 | 0 | 0 | 1 | 1 | 0 | 0 | 1 | 1 | 1 |
| T = 2 | 0 | 0 | 0 | 0 | 0 | 0 | 0 | 0 | 0 | 0 | 0 |
| T = 3 | 0 | 0 | M | 1 | 1 | 1 | 1 | M | 1 | 0 | 0 |

Table 1 illustrates the working of three-input multiplier 602 for five clock cycles, with the first clock showing the initial state of three-input multiplier 602. The symbol 'x' denotes a 'don't care' state—that is, the value of the signal can be a 0, 1 or unknown.

For clock cycle T=–1, 'Reset' and 'Clear' are 1, thereby resetting delay flip-flop 214 and register 712. For clock cycle T=0, 'Reset' and 'Clear' are 0, that is, disabled. Further, this is the case when one or more of the inputs 'a', 'b' and 'c' are zero. Therefore, 'Zero' is 1 for T=0 and T=1. In this case, for clock cycle T=0 itself, '$HS_{acc}$' is 1. This implies that the output available at '$Op_{acc}$' is a valid output. As is evident, $F_{init}$ is the initial value stored in register 718.

$$Ctrl(n), Ctrl(n-1)\ldots, Ctrl(0) \text{ are exclusive} \quad (4)$$

This follows from equation 2. Equation 4 implies that only one of Ctrl(n), Ctrl(n–1) ..., Ctrl(0) is 1 during the operation of the logic circuit.

If (Tautology(Ctrl(n)|Ctrl(n–1)|... Ctrl(0)==1)) then $Op_{acc}$(n) as obtained in equation 3 does not depend on $F_{init}$. (5)

Equations 1, 2 and 5 imply that if (Tautology($HS_{acc}$(n)==1)) then an error is flagged stating $F_{init}$ is unreachable. (6)

$Op_{acc}(n)$ such that Tautology($HS_{acc}(n)$==1) represents the accelerated data value Op for all possible completions of the transaction. (7)

Once a variable delay circuit is converted to a fixed delay circuit, the steps of circuit acceleration, removal of redundant flip-flops, circuit optimization, and so on, can be performed. These steps are as discussed in conjunction with FIG. 1.

The method of simplifying a logic circuit provided by the present invention can be implemented in software, hardware, or a combination thereof.

The method provided by the present invention can be implemented in software by using standard programming languages such as C, C++ and Java. The logic circuit can be represented in software using high-level hardware description languages (HDLs) such as Verilog HDL and VHDL. For example, RTL description of a circuit design, developed using VHDL, is represented as a set of modules, wherein each module has an interface that describes how it is connected to other modules. Modules can represent/model physical electronic elements such as simple logic gates to complete systems, for example, a microprocessor. Software libraries like Boolean Satisfiability (SAT) and Binary Decision Diagrams (BDD) packages can be used for formal reasoning required in various steps of this method. Software libraries can also be used to map logic circuit descriptions (in Verilog, VHDL and C) into computer memory for further processing as defined by the steps of this method. Software tools like editors can be used to create the software program in high level languages like C++ and map it onto computer instructions by using off the shelf compilers.

The information disclosed here enables a person skilled in the art to implement the method steps of the present invention in software. For example, the step of combining two logic circuits during circuit acceleration can be performed by combining various modules belonging to the two logic circuits, and mapping the output of the first circuit to the input of the second circuit. Further, the step of identifying constant flip-flops can be performed by using various modules representing flip-flops, and standard programming language constructs (such as variables, data operators, if-then-else constructs, and data structure elements such as a linked list representing the RESET list).

The method of simplifying a logic circuit, as described in the disclosed invention or any of its components may be embodied in the form of a processing machine. Typical examples of a processing machine include a general-purpose computer, a programmed microprocessor, a digital signal processor (DSP), a micro-controller, a peripheral integrated circuit element, and other devices or arrangements of devices, which are capable of implementing the steps that constitute the method of the disclosed invention.

The processing machine executes a set of instructions (corresponding to the method steps of the present invention) that are stored in one or more storage elements (also referred to as computer usable medium). The storage elements may also hold data or other information as desired, such as RTL description of the logic circuit. The storage element may be in the form of a database or a physical memory element present in the processing machine. The physical memory can be, for example but not limited to, an electronic, magnetic, optical, electromagnetic, infrared, or semiconductor system, apparatus, device, or propagation medium. More specific examples of the physical memory include, but not limited to, the following: a random access memory (RAM) a read-only memory (ROM), an erasable programmable read-only memory (EPROM or Flash memory), a Hard Disc Drive (HDD) and a compact disc read-only memory (CDROM).

The set of instructions may include various instructions that instruct the processing machine to perform the steps that constitute the method of simplifying a logic circuit for enabling equivalence checking. The set of instructions may be in the form of a program or software. The software may be in various forms such as system software or application software. Further, the software might be in the form of a collection of separate programs, a program module with a larger program or a portion of a program module. The software might also include modular programming in the form of object-oriented programming. The processing of input data by the processing machine may be in response to user commands, or in response to results of previous processing or in response to a request made by another processing machine.

While the various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method of simplifying a logic circuit, the simplification being performed for achieving cycle-by-cycle equivalence checking between the logic circuit and a second logic circuit, the logic circuit being a sequential logic circuit or a combinational logic circuit, the method comprising the steps of:
   a. identifying whether the logic circuit is a variable delay circuit;
   b. if the logic circuit is a variable delay circuit, then converting the variable delay behavior to fixed delay behavior by adding an extra circuitry in the logic circuit;
   c. accelerating the logic circuit to produce an accelerated circuit for each output of the logic circuit, the acceleration being a circuit transform achieved by mapping the multi-cycle behavior of the logic circuit to one cycle behavior;
   d. combining all the accelerated circuits to get a combined accelerated circuit;
   e. identifying constant valued flip-flops in the combined accelerated circuit, the constant valued flip-flops being those flip-flops that do not change their values in any state of the combined accelerated circuit; and
   f. removing constant valued flip-flops from the combined accelerated circuit, the remaining circuit being termed as a simplified accelerated circuit.

2. The method as recited in claim 1 further comprising the step of obtaining a simplified second accelerated circuit from the second logic circuit by performing steps a to f recited in claim 1.

3. The method as recited in claim 2 further comprising the step of performing equivalence checking on the simplified accelerated circuit and the simplified second accelerated circuit.

4. The method as recited in claim 1 wherein the step of identifying constant valued flip-flops comprises the step of determining the values of flip-flops in the combined accelerated circuit during each clock cycle.

5. The method as recited in claim 1 wherein the constant valued flip-flops are identified using the process of iterative relaxation.

6. The method as recited in claim 5 wherein the process of iterative relaxation comprises the steps of:
   a. initializing a RESET list that includes the flip-flops with known reset values in the accelerated logic circuit;
   b. starting all flip-flops in the accelerated logic circuit;
   c. computing the next state equations of these flip-flops;
   d. identifying a subset of flip-flops in the RESET list, which do not reach reset values;
   e. if the subset of flip-flops is not empty, then removing the flip-flops belonging to the subset from the RESET list; and
   f. repeating steps b-e until the subset of flip-flops becomes empty.

7. The method as recited in claim 1 wherein the step of removing constant valued flip-flops comprises the step of performing constant propagation in the combined accelerated circuit.

8. The method as recited in claim 1 further comprises the step of performing dead code elimination in the combined accelerated circuit.

9. A computer program product for use with a computer, the computer program product comprising a computer usable medium having a computer readable program code embodied therein for simplifying a logic circuit, the simplification being performed for achieving cycle-by-cycle equivalence checking between the logic circuit and a second logic circuit, the computer program product performing the steps of:
   a. identifying whether the logic circuit is a variable delay circuit;
   b. if the logic circuit is a variable delay circuit, then converting the variable delay behavior to fixed delay behavior by adding an extra circuitry in the logic circuit;
   c. accelerating the logic circuit to produce an accelerated circuit for each output of the logic circuit, the acceleration being a circuit transform achieved by mapping the multi-cycle behavior of the logic circuit to one cycle behavior;
   d. combining all the accelerated circuits to get a combined accelerated circuit;
   e. identifying constant valued flip-flops in the combined accelerated circuit, the constant valued flip-flops being those flip-flops that do not change their values in any state of the combined accelerated circuit; and
   f. removing constant valued flip-flops from the combined accelerated circuit, the remaining circuit being termed as a simplified accelerated circuit.

* * * * *